(12) United States Patent
Wang et al.

(10) Patent No.: US 11,302,601 B1
(45) Date of Patent: Apr. 12, 2022

(54) IGBT MODULE WITH HEAT DISSIPATION STRUCTURE AND METHOD FOR MANUFACTURING THE SAME

(71) Applicant: AMULAIRE THERMAL TECHNOLOGY, INC., New Taipei (TW)

(72) Inventors: Tzu-Hsuan Wang, New Taipei (TW); Tze-Yang Yeh, New Taipei (TW); Chih-Hung Shih, Hsinchu County (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 17/128,204

(22) Filed: Dec. 21, 2020

(51) Int. Cl.
  *H01L 23/373* (2006.01)
  *H01L 23/367* (2006.01)
  *H01L 23/00* (2006.01)

(52) U.S. Cl.
  CPC ........ *H01L 23/3731* (2013.01); *H01L 23/367* (2013.01); *H01L 23/3737* (2013.01); *H01L 24/27* (2013.01); *H01L 24/32* (2013.01); *H01L 2224/29147* (2013.01)

(58) Field of Classification Search
  CPC .............. H01L 23/3731; H01L 23/367; H01L 23/3737
  See application file for complete search history.

(56) References Cited

U.S. PATENT DOCUMENTS

2017/0345735 A1\* 11/2017 Yang .................. H01L 23/3735

FOREIGN PATENT DOCUMENTS

| TW | M244580 U | 9/2004 |
|---|---|---|
| TW | 201017692 A | 5/2010 |
| TW | 202021069 A | 6/2020 |

\* cited by examiner

*Primary Examiner* — Peniel M Gumedzoe
(74) *Attorney, Agent, or Firm* — Li & Cai Intellectual Property Office

(57) ABSTRACT

An IGBT module with a heat dissipation structure and a method for manufacturing the same are provided. The IGBT module with a heat dissipation structure includes a layer of IGBT chips, a bonding layer, a thick copper layer, a thermally-conductive and electrically-insulating layer, and a heat dissipation layer. A portion of the thermally-conductive and electrically-insulating layer is made of a polymer composite material, and a remaining portion of the thermally-conductive and electrically-insulating layer is made of a ceramic material. The thick copper layer is bonded onto the thermally-conductive and electrically-insulating layer by hot pressing. A fillet is formed at a bottom edge of the thick copper layer, and the bottom edge of the thick copper layer is embedded into the thermally-conductive and electrically-insulating layer.

4 Claims, 5 Drawing Sheets

IGBT MODULE WITH HEAT DISSIPATION STRUCTURE AND METHOD FOR MANUFACTURING THE SAME

FIELD OF THE DISCLOSURE

The present disclosure relates to an IGBT (insulated gate bipolar transistor) module, and more particularly to an IGBT module with a heat dissipation structure and a method for manufacturing the same.

BACKGROUND OF THE DISCLOSURE

Most high-power inverters currently used in electric vehicles/hybrid vehicles use IGBT (insulated gate bipolar transistor) chips. Therefore, the heat generated by the high-power inverters during operation will cause the temperature of the IGBT chip to rise. If no proper heat dissipation measures are incorporated, the temperature of the IGBT chip may exceed the allowable temperature, and result in deterioration of performance and damage of the IGBT chip. Therefore, the IGBT heat dissipating efficiency has become a major problem in the industry.

The direct bonded copper (DBC) substrate has become the material of choice for present IGBT heat dissipation structures. Referring to FIG. 1 and FIG. 2, the conventional IGBT module with the heat dissipation structure mainly includes a layer 11A of IGBT chips, an upper solder layer 12A, a DBC substrate 13A, a lower solder layer 14A, and a heat dissipation layer 15A. Among them, the DBC substrate 13A includes, from top to bottom, an upper thin copper layer 131A, a ceramic layer 132A, and a lower thin copper layer 133A.

However, the DBC substrate 13A has a multilayer structure and limited heat-conducting ability. When heat is generated by the layer 11A of IGBT chips, it cannot be transferred to the heat dissipation layer 15A through the DBC substrate 13A in time. Moreover, the connection between the DBC substrate 13A and the heat dissipation layer 15A can only be made through the lower solder layer 14A. In practice, the entire lower solder layer 14A is highly prone to experience an empty soldering phenomenon which causes an increase in interface impedance, thereby affecting the effectiveness of thermal conductivity.

SUMMARY OF THE DISCLOSURE

In response to the above-referenced technical inadequacies, the present disclosure provides an IGBT module with a heat dissipation structure and a method for manufacturing the same that can overcome the aforementioned drawbacks.

In one aspect, the present disclosure provides an IGBT module with a heat dissipation structure, including a layer of IGBT chips, a bonding layer, a thick copper layer, a thermally-conductive and electrically-insulating layer, and a heat dissipation layer. The thermally-conductive and electrically-insulating layer is disposed on the heat dissipation layer. A portion of the thermally-conductive and electrically-insulating layer is made of a polymer composite material, and a remaining portion of the thermally-conductive and electrically-insulating layer is made of a ceramic material. The thick copper layer is bonded onto the thermally-conductive and electrically-insulating layer by hot pressing. A fillet is formed at a bottom edge of the thick copper layer, and the bottom edge of the thick copper layer is embedded into the thermally-conductive and electrically-insulating layer. The bonding layer is disposed on the thick copper layer. The layer of IGBT chips is disposed on the bonding layer.

In certain embodiments, the thermally-conductive and electrically-insulating layer contains 50% to 95% by weight of the ceramic material.

In certain embodiments, a radius of the fillet formed at the bottom edge of the thick copper layer is 0.3 to 5 mm.

In certain embodiments, the thick copper layer has a thickness that is smaller than or equal to 10000 μm.

In another aspect, the present disclosure provides a method for manufacturing an IGBT module with a heat dissipation structure, including the steps of: (a) providing a fixture; (b) placing at least one thick copper block into the fixture, and the at least one thick copper block having a fillet formed at a bottom edge of the at least one thick copper block; (c) hot pressing the fixture together with the at least one thick copper block onto a thermally-conductive and electrically-insulating layer being formed on a heat dissipation layer, such that the bottom edge of the at least one thick copper block is embedded into the thermally-conductive and electrically-insulating layer, so that the at least one thick copper block is formed into a thick copper layer on the thermally-conductive and electrically-insulating layer; (d) removing the fixture; (e) forming a bonding layer on the thick copper layer; and (f) forming a layer of IGBT chips on the bonding layer.

In certain embodiments, the fixture is an anti-stick fixture.

In certain embodiments, at least one hollow region is formed in the fixture, and the at least one thick copper block can be placed in the at least one hollow region.

In certain embodiments, an area of the fixture is the same as that of the heat dissipation layer.

In certain embodiments, a portion of the thermally-conductive and electrically-insulating layer is made of a polymer composite material, and a remaining portion of the thermally-conductive and electrically-insulating layer is made of a ceramic material.

One of the advantages of the present disclosure is that the thermally-conductive and electrically-insulating layer is partially made of a polymer composite material and can therefore be used for insulating and bonding purposes. Meanwhile, the remaining portion of the thermally-conductive and electrically-insulating layer is made of a ceramic material, which improves the thermal conductivity. In addition, the thick copper layer has a fillet formed at its bottom edge, so that when the bottom of the thick copper layer is embedded into the thermally-conductive and electrically-insulating layer, the thermally-conductive and electrically-insulating layer is not susceptible to rupture due to pressure. Moreover, the IGBT module with the heat dissipation structure in accordance with the present disclosure forms the thick copper layer and the thermally-conductive and electrically-insulating layer to rapidly and uniformly conduct the heat of the IGBT chips to the heat dissipation fins of the heat dissipation layer. Compared with the DBC substrate for the heat dissipation structure of the conventional IGBT module, the IGBT module with the heat dissipation structure of the present disclosure can simultaneously achieve the advantages of the heat dissipation uniformity of the thick copper layer and the insulation and thermal conductivity of the thermally-conductive and electrically-insulating layer. Moreover, there is no need to have a solder layer, but instead the thermally-conductive and electrically-insulating layer is directly formed on the surface of the heat dissipation layer. As such, the heat conduction performance will neither be affected by the issues of empty soldering and the interface impedance of the solder layer, nor will it be affected by the multilayer structure of the DBC substrate, thereby making the heat dissipation layer capable of having maximum heat absorption and heat dissipation performances.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
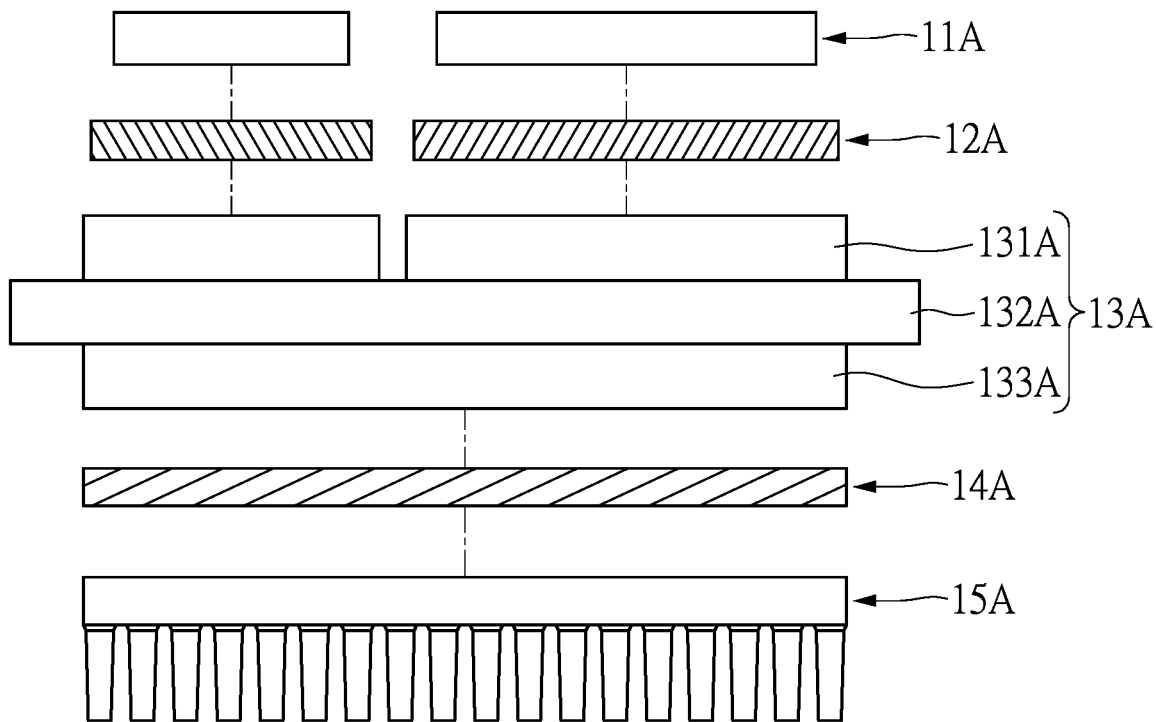
FIG. 1 is an exploded side schematic view illustrating a conventional IGBT module with a heat dissipation structure.
Figure 2:
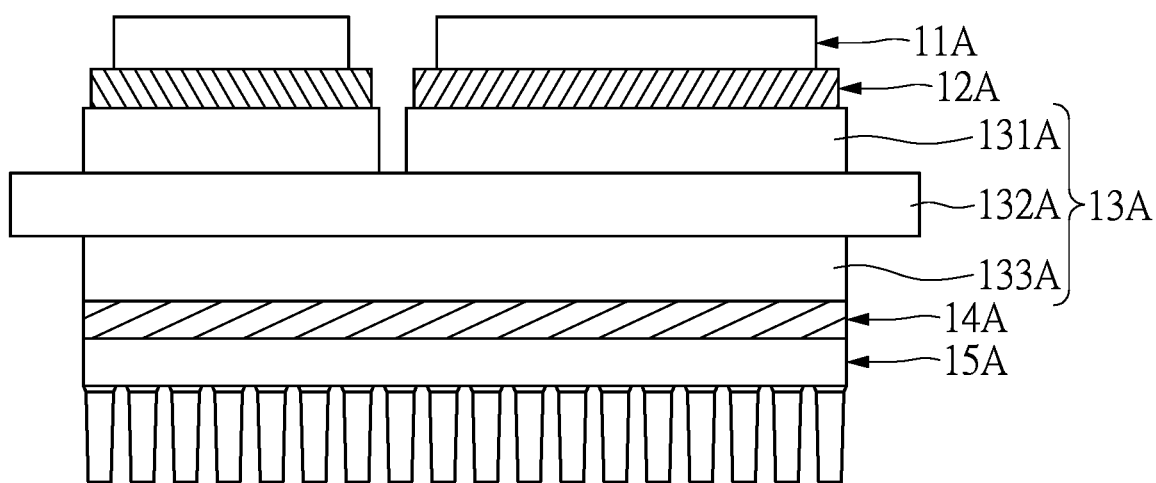
FIG. 2 is a side schematic view illustrating a conventional IGBT module with a heat dissipation structure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
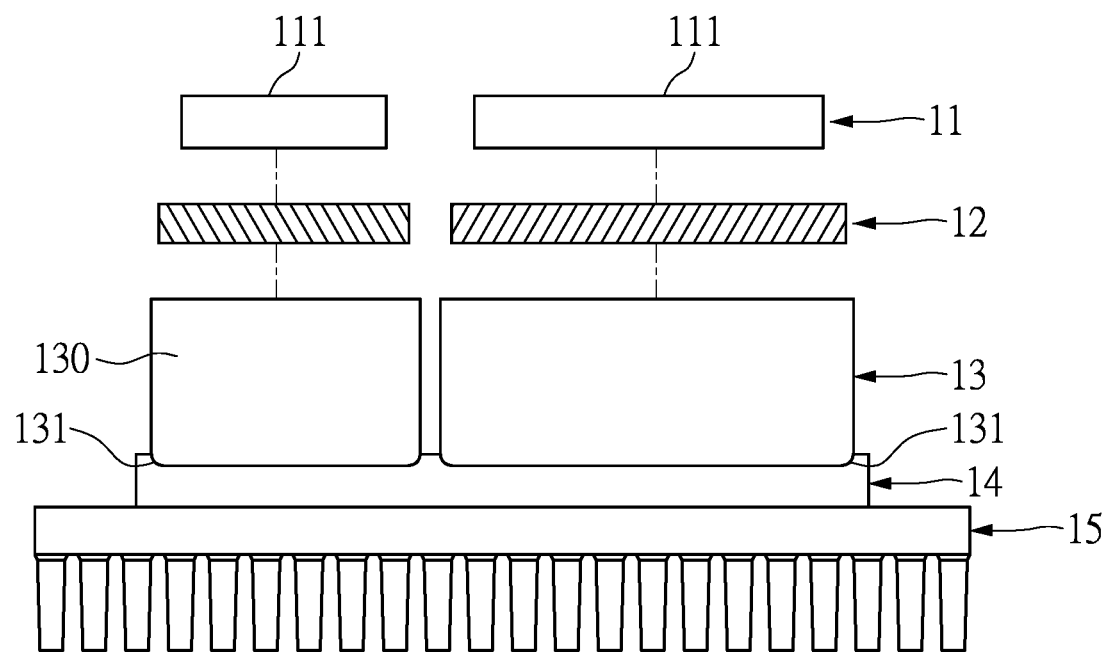
FIG. 3 is an exploded side schematic view illustrating an IGBT module with a heat dissipation structure of the present disclosure.
Figure 4:
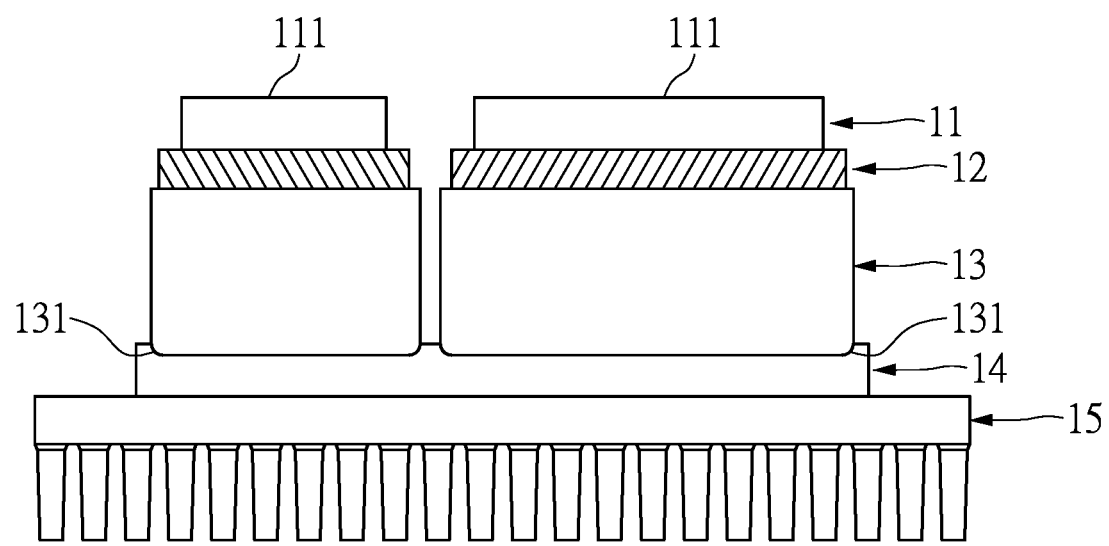
FIG. 4 is a side schematic view illustrating an IGBT module with a heat dissipation structure of the present disclosure.
Figure 5:
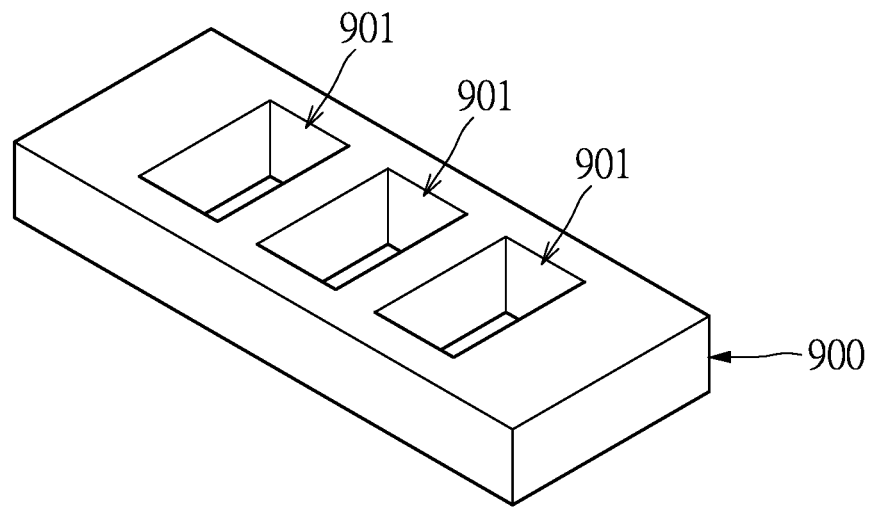
FIGS. 5 to 9 are schematic diagrams showing the components during the process of manufacturing an IGBT module with a heat dissipation structure of the present disclosure.
Figure 6:
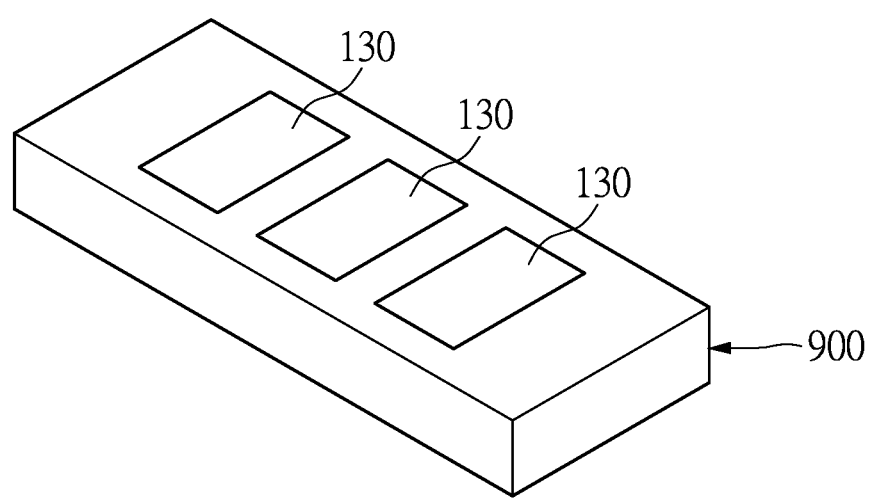
Figure 7:
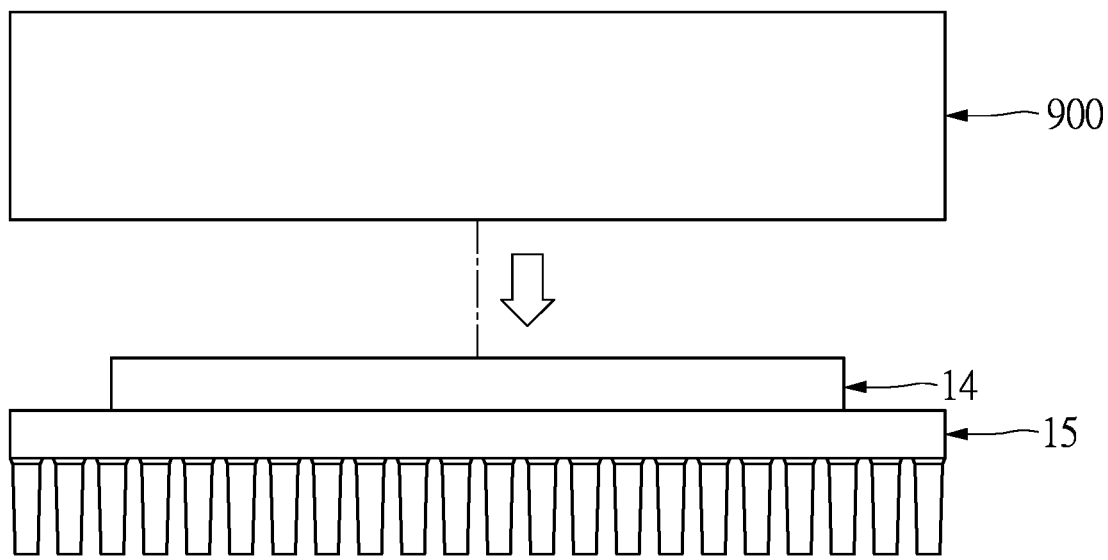
Figure 8:
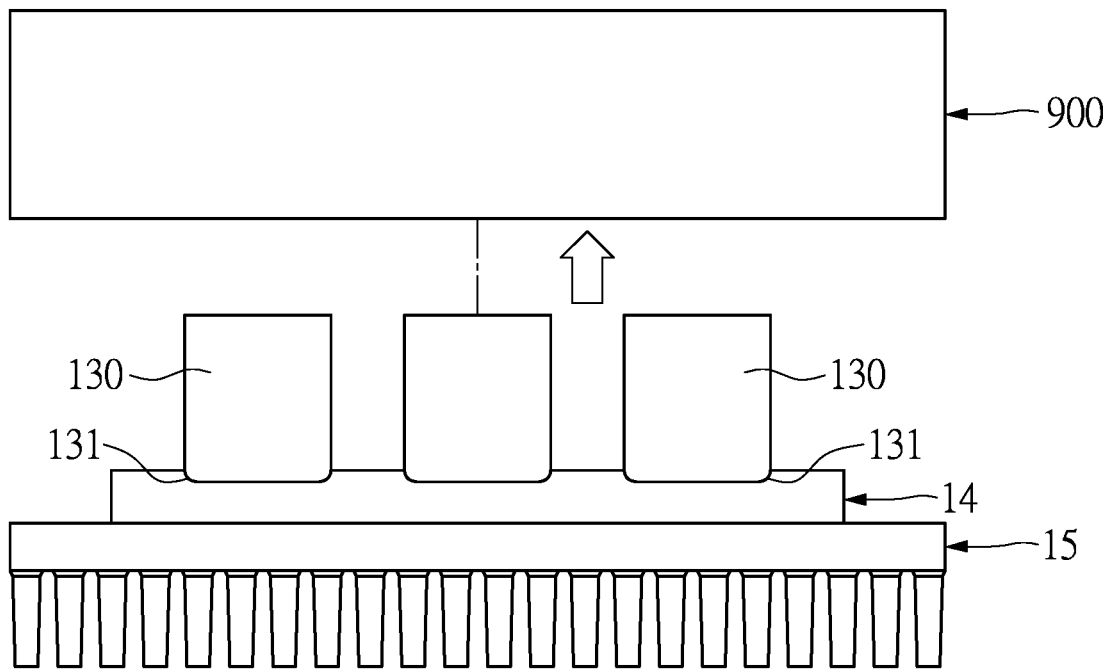
Figure 9:
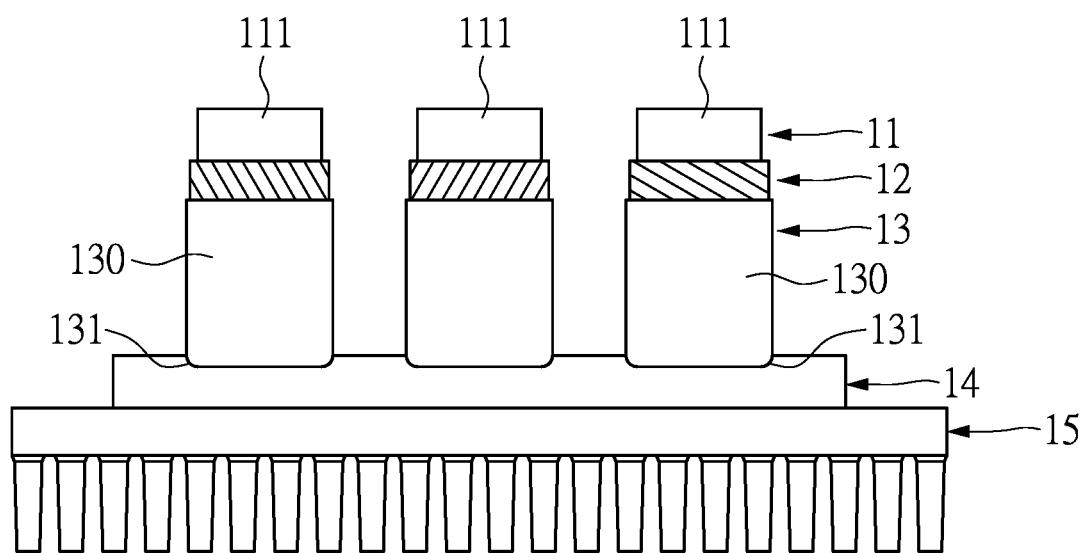

Referring to FIG. 3 and FIG. 4, the present disclosure provides an IGBT module with a heat dissipation structure.

As shown in FIG. 3 and FIG. 4, the IGBT module with the heat dissipation structure in accordance with the present disclosure includes, from top to bottom, a layer 11 of IGBT chips 111, a bonding layer 12, a thick copper layer 13, a thermally-conductive and electrically-insulating layer 14, and a heat dissipation layer 15.

The thermally-conductive and electrically-insulating layer 14 is disposed on the heat dissipation layer 15. The heat dissipation layer 15 can be an aluminum heat sink, a water-cooling heat dissipation device, or a metal plate with a heat dissipation function, but is not limited thereto. In addition, the thermally-conductive and electrically-insulating layer 14 is partially made of a polymer composite material and therefore can be used for insulating and bonding purposes. Meanwhile, a remaining portion of the thermally-conductive and electrically-insulating layer 14 can be made of a ceramic material, which improves the thermal conductivity.

Further, the polymer composite material contained in the thermally-conductive and electrically-insulating layer 14 can be an epoxy-based composite to be used for forming insulation. Also, the ceramic material contained in the thermally-conductive and electrically-insulating layer 14 is preferably 50-95% by weight to achieve the best thermal conductivity.

In one embodiment, the thermally-conductive and electrically-insulating layer 14 can be formed by mixing epoxy-based composite with ceramic powder, but is not limited thereto.

The thick copper layer 13 is disposed on the thermally-conductive and electrically-insulating layer 14, such that the thick copper layer 13 and the heat dissipation layer 15 pass through the thermally-conductive and electrically-insulating 14 to form insulation there-between. It also allows the thick copper layer 13 to conduct heat through the thermally-conductive and electrically-insulating 14 to the heat dissipation layer 15.

Furthermore, the thick copper layer 13 is bonded onto the thermally-conductive and electrically-insulating layer 14 containing a ceramic material by hot pressing. The thick copper layer 13 may be composed of at least one thick copper block 130.

Moreover, in order to avoid the thermally-conductive and electrically-insulating layer 14 from being easily ruptured by the sharp corner pressure of the at least one thick copper block 130 when the at least one thick copper block 130 is partly pressed into the thermally-conductive and electrically-insulating layer 14 to form the thick copper layer 13, the at least one thick copper block 130 of this embodiment, also known as the thick copper layer 13, has a fillet 131 formed at its bottom edge, so that when the bottom of the thick copper layer 13 is embedded into the thermally-conductive and electrically-insulating layer 14, the thermally-conductive and electrically-insulating layer 14 is not susceptible to rupture due to pressure.

Preferably, the radius of the fillet 131 formed at the bottom edge of the thick copper layer 13 is 0.3 to 5 mm, so that when the bottom of the thick copper layer 13 is embedded into the thermally-conductive and electrically-insulating layer 14, the thermally-conductive and electrically-insulating layer 14 is not susceptible to rupture due to pressure.

In this embodiment, since the thick copper layer 13 is embedded into the insulating layer 14 by hot pressing, the thickness of the thick copper layer 13 can be at least 1,000 μm, and even up to 10,000 μm. Therefore, compared to the thickness of about 300 μm for the thin copper layer of the DBC substrate for the heat dissipation structure of the conventional IGBT module, the improved heat dissipation structure of the IGBT module of the present disclosure can increase the uniformity of the heat dissipation structure and the overall heat conduction efficiency through the thick copper layer 13 having a thickness up to about 10,000 µm.

The bonding layer 12 is disposed on the thick copper layer 13, and a layer 11 of IGBT chips 111 is disposed on the bonding layer 12. The bonding layer 12 can be a tin bonding layer, but it can also be a sintered silver layer. The layer 11 of IGBT chips 111 may include one or more IGBT chips 111. In addition, the one or more IGBT chips 111 are bonded onto the thick copper layer 13 through the bonding layer 12. The heat generated by the one or more IGBT chips 111 can be conducted to the heat dissipation layer 15 by the thick copper layer 13 and the thermally-conductive and electrically-insulating layer 14 to be dissipated outward.

Referring to FIG. 5 to FIG. 9, the present disclosure also provides a method for manufacturing an IGBT module with a heat dissipation structure, and the method includes steps that are described as follows.

(a) A fixture 900 is provided, which may be made of metal, rubber, or plastic, but may also be made of virtually any non-adhesive material and not limited to the above-mentioned materials. That is, the fixture 900 of this embodiment can be an anti-stick fixture.

(b) At least one thick copper block 130 is placed into the fixture 900, and the at least one thick copper block 130 can be flush with the fixture 900 to facilitate hot pressing. The fixture 900 forms at least one hollow region 901 in which at least one thick copper block 130 can be placed. The fixture 900 in this embodiment forms three hollow regions 901 in which three thick copper blocks 130 can be placed, and fillets 131 are formed at the bottom edges of the thick copper blocks 130. In addition, the area of the fixture 900 of this embodiment can be the same as that of the heat sink (that is, heat dissipation layer 15) for easy positioning.

(c) The fixture 900 together with the at least one thick copper block 130 is hot pressed onto a heat dissipation layer 15 with a thermally-conductive and electrically-insulating layer 14 formed thereon, so that the bottom edge of the at least one thick copper block 130 is embedded into the thermally-conductive and electrically-insulating layer 14, thereby making the at least one thick copper block 130 to form into a thick copper layer 13 on the thermally-conductive and electrically-insulating layer 14. Since the fillet 131 is formed at the bottom edge of the thick copper block 130 in this embodiment, when the bottom edge of the thick copper block 130 is embedded into the thermally-conductive and electrically-insulating layer 14, the thermally-conductive and electrically-insulating layer 14 is not susceptible to rupture due to pressure. In one embodiment, a plurality of thick copper blocks 130 may be pre-formed in a predetermined pattern, thereby forming the thick copper layer 13 in the predetermined pattern on the thermally-conductive and electrically-insulating layer 14 through transfer printing.

(d) The fixture 900 is removed. Since the fixture 900 is the anti-stick fixture, it can be easily removed after hot pressing is completed.

(e) A bonding layer 12 is formed on the thick copper layer 13.

(f) A layer 11 of IGBT chips is formed on the bonding layer 12.

In conclusion, the thermally-conductive and electrically-insulating layer 14 is partially made of a polymer composite material and can therefore be used for insulating and bonding purposes. Meanwhile, the remaining portion of the thermally-conductive and electrically-insulating layer 14 is made of a ceramic material, which improves the thermal conductivity. In addition, the thick copper layer 13 has a fillet 131 formed at its bottom edge, so that when the bottom of the thick copper layer 13 is embedded into the thermally-conductive and electrically-insulating layer 14, the thermally-conductive and electrically-insulating layer 14 is not susceptible to rupture due to pressure. Moreover, the IGBT module with the heat dissipation structure in accordance with the present disclosure forms the thick copper layer 13 and the thermally-conductive and electrically-insulating layer 14 to rapidly and uniformly conduct the heat of the IGBT chips to the heat dissipation fins of the heat dissipation layer 15. Compared with the DBC substrate for the heat dissipation structure of the conventional IGBT module, the IGBT module with the heat dissipation structure of the present disclosure can simultaneously achieve the advantages of the heat dissipation uniformity of the thick copper layer 13 and the insulation and thermal conductivity of the thermally-conductive and electrically-insulating layer 14. Moreover, there is no need to have a solder layer, but instead the thermally-conductive and electrically-insulating layer 14 is directly formed on the surface of the heat dissipation layer 15. As such, the heat conduction performance will neither be affected by the issues of empty soldering and the interface impedance of the solder layer, nor will it be affected by the multilayer structure of the DBC substrate, thereby making the heat dissipation layer 15 capable of having maximum heat absorption and heat dissipation performances.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An IGBT (insulated gate bipolar transistor) module with a heat dissipation structure, comprising: a layer of IGBT chips, a bonding layer, a thick copper layer, a thermally-conductive and electrically-insulating layer, and a heat dissipation layer; wherein the thermally-conductive and electrically-insulating layer is disposed on the heat dissipation layer; wherein a portion of the thermally-conductive and electrically-insulating layer is made of a polymer composite material, and a remaining portion of the thermally-conductive and electrically-insulating layer is made of a ceramic material; wherein the thick copper layer is bonded onto the thermally-conductive and electrically-insulating layer by hot pressing; wherein a fillet is formed at a bottom edge of the thick copper layer, and the bottom edge of the thick copper layer is embedded into the thermally-conductive and electrically-insulating layer; wherein the bonding layer is disposed on the thick copper layer, and the layer of IGBT chips is disposed on the bonding layer.

2. The IGBT module with the heat dissipation structure according to claim 1, wherein the thermally-conductive and electrically-insulating layer contains 50% to 95% by weight of the ceramic material.

3. The IGBT module with the heat dissipation structure according to claim 2, wherein a radius of the fillet formed at the bottom edge of the thick copper layer is 0.3 to 5 mm.

4. The IGBT module with the heat dissipation structure according to claim 3, wherein the thick copper layer has a thickness that is smaller than or equal to 10000 μm.

\* \* \* \* \*